US009905513B1

(12) United States Patent
Briggs et al.

(10) Patent No.: US 9,905,513 B1
(45) Date of Patent: Feb. 27, 2018

(54) SELECTIVE BLOCKING BOUNDARY PLACEMENT FOR CIRCUIT LOCATIONS REQUIRING ELECTROMIGRATION SHORT-LENGTH

(71) Applicant: INTERNATIONAL BUSINESS MACHINES CORPORATION, Armonk, NY (US)

(72) Inventors: Benjamin D. Briggs, Waterford, NY (US); Elbert Huang, Carmel, NY (US); Joe Lee, Albany, NY (US); Christopher J. Penny, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/332,194

(22) Filed: Oct. 24, 2016

(51) Int. Cl.
*H01L 29/06* (2006.01)
*H01L 23/528* (2006.01)
*H01L 21/768* (2006.01)
*H01L 23/522* (2006.01)
*H01L 23/532* (2006.01)

(52) U.S. Cl.
CPC ........ *H01L 23/528* (2013.01); *H01L 21/7684* (2013.01); *H01L 21/76802* (2013.01); *H01L 21/76849* (2013.01); *H01L 21/76883* (2013.01); *H01L 23/5226* (2013.01); *H01L 23/53238* (2013.01)

(58) Field of Classification Search
None
See application file for complete search history.

(56) References Cited

U.S. PATENT DOCUMENTS

| 5,439,731 | A  | 8/1995  | Li            |
| 6,633,085 | B1 | 10/2003 | Besser et al. |
| 6,689,689 | B1 | 2/2004  | Besser et al. |
| 6,734,559 | B1 | 5/2004  | Yang et al.   |
| 6,861,758 | B2 | 1/2005  | Jan           |

(Continued)

OTHER PUBLICATIONS

Anonymous, "A Method for an ADL Barrier Using a Diffusion-Blocking Boundary Layer", IP.com (Nov. 14, 2005) IP.com No. IPCOM000131679D. pp. 1-5.

(Continued)

*Primary Examiner* — Cuong Q Nguyen
*Assistant Examiner* — Nishath Yasmeen
(74) *Attorney, Agent, or Firm* — Tutunjian & Bitetto, P.C.; Jennifer Davis (57) ABSTRACT

A method is presented for forming a semiconductor structure. The method includes depositing an insulating layer over a semiconductor substrate, etching the insulating layer to form trenches for receiving copper (Cu), selectively recessing the Cu at one or more of the trenches corresponding to circuit locations requiring electromigration (EM) short-length, and forming self-aligned conducting caps over the one or more trenches where the Cu has been selectively recessed. The conducting caps can be tantalum nitride (TaN) caps. The method further includes forming a via extending into each of the trenches for receiving Cu. Additionally, the via for trenches including recessed Cu extends to the self-aligned conducting cap, whereas the via for trenches including non-recessed Cu extends to a top surface of the Cu.

10 Claims, 4 Drawing Sheets

(56) References Cited

U.S. PATENT DOCUMENTS

| | | | |
|---|---|---|---|
| 6,927,113 B1 | 8/2005 | Sahota et al. | |
| 6,979,625 B1 | 12/2005 | Woo et al. | |
| 7,008,871 B2 | 3/2006 | Andricacos et al. | |
| 7,157,795 B1* | 1/2007 | Erb | H01L 21/2855 |
| | | | 257/751 |
| 8,415,261 B1 | 4/2013 | Reid et al. | |
| 9,385,038 B2 | 7/2016 | Angyal et al. | |
| 2009/0081870 A1* | 3/2009 | Takewaki | H01L 21/2885 |
| | | | 438/687 |
| 2009/0294901 A1* | 12/2009 | Bonilla | H01L 23/5256 |
| | | | 257/529 |
| 2009/0294973 A1* | 12/2009 | Chanda | H01L 23/528 |
| | | | 257/767 |
| 2014/0203435 A1* | 7/2014 | Angyal | H01L 21/7685 |
| | | | 257/751 |

OTHER PUBLICATIONS

IBM, "Noble Metal Cap for BEOL Applications," IP.com (Nov. 14, 2005) IP.com No. IPCOM000131679D. pp. 1-9.

\* cited by examiner

SELECTIVE BLOCKING BOUNDARY PLACEMENT FOR CIRCUIT LOCATIONS REQUIRING ELECTROMIGRATION SHORT-LENGTH

BACKGROUND

Technical Field

The present invention relates generally to semiconductor devices, and more specifically, to the formation of interconnect structures with selective local metal cap regions for improved electromigration behavior.

Description of the Related Art

Integrated circuits are typically fabricated with multiple levels of patterned metallization lines, electrically separated from one another by interlayer dielectrics containing vias at selected locations to provide electrical connections between levels of the patterned metallization lines. As these integrated circuits are scaled to smaller dimensions in a continual effort to provide increased density and performance (e.g., by increasing device speed and providing greater circuit functionality within a given area chip), the interconnect linewidth dimension becomes increasingly narrow, which in turn renders them more susceptible to effects such as electromigration.

Electromigration becomes increasingly more significant in integrated circuit design, as relative current densities through metallization lines continue to increase as the linewidth dimensions shrink.

SUMMARY

In accordance with an embodiment, a method is provided for forming a semiconductor structure. The method includes depositing an insulating layer over a semiconductor substrate, etching the insulating layer to form trenches for receiving copper (Cu), selectively recessing the Cu at one or more of the trenches corresponding to circuit locations requiring electromigration (EM) short-length, and forming self-aligned conducting caps over the one or more trenches where the Cu has been selectively recessed.

In accordance with another embodiment, a semiconductor device is provided. The semiconductor device includes an insulating layer deposited over a semiconductor substrate, trenches formed by etching the insulating layer, the trenches configured to receive copper (Cu), wherein the Cu is selectively recessed at one or more of the trenches corresponding to circuit locations requiring electromigration (EM) short-length, and self-aligned conducting caps formed over the one or more trenches where the Cu has been selectively recessed.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments of the present invention relate generally to a method for forming a semiconductor structure. The method includes depositing an insulating layer over a semiconductor substrate, etching the insulating layer to form trenches for receiving copper (Cu), selectively recessing the Cu at one or more of the trenches corresponding to circuit locations requiring electromigration (EM) short-length, and forming self-aligned conducting caps over the one or more trenches where the Cu has been selectively recessed.

Moreover, embodiments of the present invention relate generally to a semiconductor device. The semiconductor device includes an insulating layer deposited over a semiconductor substrate, trenches formed by etching the insulating layer, the trenches configured to receive copper (Cu), wherein the Cu is selectively recessed at one or more of the trenches corresponding to circuit locations requiring electromigration (EM) short-length, and self-aligned conducting caps formed over the one or more trenches where the Cu has been selectively recessed.

In one or more embodiments, localized (selective) self-aligned metal caps are created atop of interconnects to provide a blocking boundary at a via bottom in specific circuit locations that require electromigration (EM) short-length. Other via bottom interfaces are left undisturbed to allow for low via resistance in locations where circuits demand it.

In one or more embodiments, the blocking boundary can be created directly underneath the via, whereas in other embodiments the blocking boundary can be created in an area or region surrounding the via.

In one or more embodiments, a blocking boundary is only placed where needed (i.e., not under all the vias). The blocking boundary is placed where short-length is needed. As a result, the via resistance can be very low for critical circuits where a blocking boundary is not necessary. The blocking boundary does not impact trench resistance or capacitance since the blocking boundary is limited to select vias. Therefore, a developer can leverage airgap patterning and reverse liner approaches and the proof of the concept structure can be performed by using a via mask for blocking boundary placement. The via blocking boundary mask can be at pitch lithography for placement of the blocking boundary only under the via or could be more crude and span multiple lines (e.g., the via landing only on one).

In one or more embodiments, a method and structure is presented for applying the metal cap only in certain regions of interest on the chip. The method and structure also allow for the utilization of the short-length effect for significantly higher electromigration lifetimes. The method and structure also enable the creation of a blocking boundary to prevent copper diffusion and enable the use of the short-length effect. The method and structure also allow for selectively creating the blocking boundary on the top of the metal line below before the via is formed.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, the term "silicide" is an alloy of a metal and silicon.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

The terms "gas" and "gases" are used interchangeably, unless otherwise noted, and refer to one or more precursors, reactants, catalysts, carrier, purge, cleaning, combinations thereof, as well as any other fluid introduced into the chamber body.

As used herein, a surface is "substantially planar" if the surface is intended to be planar and the non-planarity of the surface is limited by imperfections inherent in the processing steps that are employed to form the surface.

As used herein, a "mounting structure" is any structure to which a semiconductor chip can be mounted by making electrical connections thereto. A mounting structure can be a packaging substrate, an interposer structure, or another semiconductor chip.

The semiconductor devices described herein can be any type of device. Exemplary types of semiconductor devices include planar field effect transistors (FETs), fin-type field effect transistors (FinFETs), nanowire/nanosheet devices, vertical field effect transistors (VFETs), or other devices.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
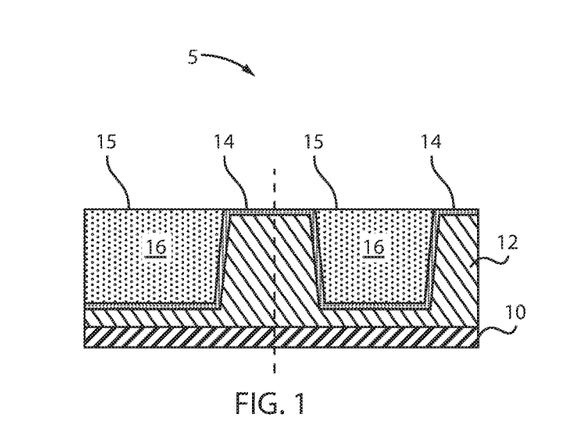
FIG. 1 is a cross-sectional view of a semiconductor structure including copper (Cu) received within recessed regions of an insulator deposited over a semiconductor substrate, in accordance with an embodiment of the present invention.

FIG. 1 is a cross-sectional view of a semiconductor structure including copper (Cu) received within recessed regions on of insulator deposited over a semiconductor substrate, in accordance with an embodiment of the present invention.

A semiconductor structure 5 includes a semiconductor substrate 10. An insulator layer 12 is deposited over the substrate 10. The insulating layer 12 is etched to form trenches thereon. A tantalum nitride (TaN) liner 14 or in the alternative a tantalum (Ta) liner 14 is deposited over the trenches, as well as the exposed portions of the insulator 12. The conductive fill material 14 is deposited, for example, by electroplating, electroless plating, chemical vapor deposition (CVD), atomic layer deposition (ALD) and/or physical vapor deposition (PVD).

The trenches are then configured to receive a conducting material. The conducting material can be a metal, such as copper (Cu) 16. A top surface 15 of the copper regions 16 can be exposed. In the exemplary embodiment, two Cu regions 16 are illustrated for the sake of clarity. One skilled in the art may contemplate a plurality of Cu regions 16 defined within the insulator layer 12.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10 including high-k oxides and/or nitrides. In one or more embodiments, the substrate 10 can be a silicon wafer. In an embodiment, the substrate 10 is a single crystal silicon wafer.

Figure 2:
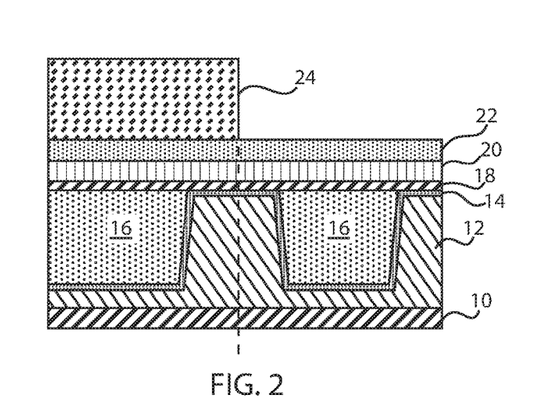
FIG. 2 is a cross-sectional view of the semiconductor structure of FIG. 1 where sacrificial layers are deposited over the copper regions, in accordance with an embodiment of the present invention.

FIG. 2 is a cross-sectional view of the semiconductor structure of FIG. 1 where sacrificial layers are deposited over the copper regions, in accordance with an embodiment of the present invention.

In various embodiments, a first sacrificial layer 18, a second sacrificial layer 20, and a low temperature oxide (LTO) 22 are deposited over the Cu regions 16, as well as the exposed portions of the insulator 12. Additionally, a photoresist 24 is used in the lithography, which defines the location desired to form the blocking boundary. Photoresist 24 is deposited over one of the Cu regions 16. The first sacrificial layer 18 can be, e.g., silicon nitride (SiN) or a dielectric cap. The second sacrificial layer 20 can be, e.g., SiN or titanium nitride (TiN).

In some embodiments, depositing the SiN layer 18 comprises exposing the metal nitride film to a first deposition gas and a second deposition gas, either simultaneously (e.g., CVD) or sequentially (e.g., ALD). The first deposition gas can comprise any suitable silicon-containing precursor and the second deposition gas can comprise any suitable reactive gas capable of reacting with the first deposition gas. In some embodiments, the first deposition gas comprises disilane and a second deposition gas comprises ammonia and exposing the plasma treated metal nitride film to the deposition gases forms a metal-SiN film.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 3:
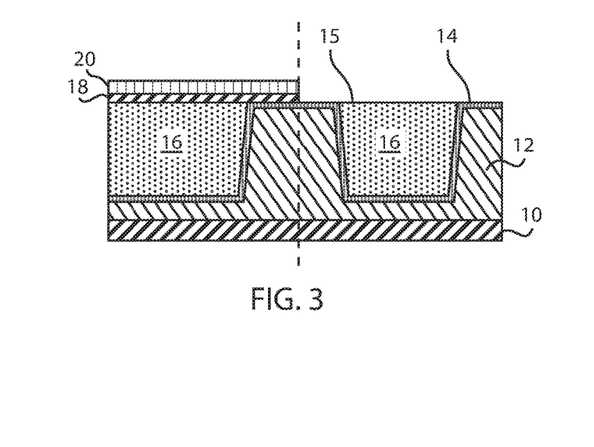
FIG. 3 is a cross-sectional view of the semiconductor device of FIG. 2 where a portion of the sacrificial layers are removed by, e.g., reactive-ion etching (RIE) to expose a top surface of one or more Cu regions, in accordance with an embodiment of the present invention.

FIG. 3 is a cross-sectional view of the semiconductor device of FIG. 2 where a portion of the sacrificial layers are removed by, e.g., reactive-ion etching (RIE) to expose a top surface of one or more Cu regions, in accordance with an embodiment of the present invention.

In various embodiments, the photoresist 24 and the LTO layer 22 are selectively etched. Additionally, the first and second sacrificial layers 18, 20 not positioned under the photoresist 24 are etched to expose the top surface 15 of the Cu region 16. In contrast, the first and second sacrificial layers 18, 20 positioned under the photoresist 24 remain intact on the other Cu region 16.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process. In one example embodiment, RIE is performed.

Concerning removal of the LTO, LTO plasma processes commonly use $N_2$ for dilution, $N_2O$ as an oxygen carrying gas, and $SiH_4$ as a silicon carrying gas. In the plasma phase these compounds are dissociated into their respective ionic components and the more mobile electrons are accelerated by high frequency RF at high power coupled to the reaction chamber to strike the plasma. There is a small negative voltage between the positive ions in the plasma and the wafer that rests on a grounded heater block. This potential difference will accelerate the ions towards the wafer surface where the ions form a layer of silicon dioxide ($SiO_2$).

High and low frequency RF power is commonly used in LTO reactors to enhance the LPCVD process. High frequency RF power is used to strike the plasma by accelerating the electrons, whereas low frequency RF power is used to enhance the densification of the layer to be formed as it keeps heavier ions mobile for an extended time.

Figure 4:
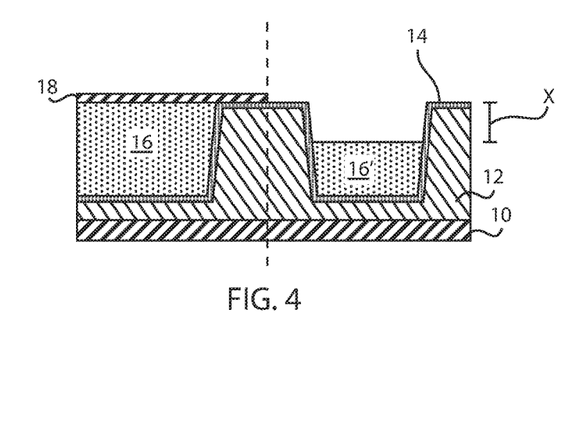
FIG. 4 is a cross-sectional view of the semiconductor device of FIG. 3 where the exposed Cu region is recessed, in accordance with an embodiment of the present invention.

FIG. 4 is a cross-sectional view of the semiconductor device of FIG. 3 where the exposed Cu region is recessed, in accordance with an embodiment of the present invention.

In various embodiments, further etching is performed to remove the SiN layer 20 and to recess the exposed Cu region 16. The recessed Cu region 16' can be accomplished by, e.g., wet etching. The Cu region 16' can be recessed by a distance "X." The SiN layer 20 can be removed or stripped by a DHF (dilute hydrofluoric acid) solution.

Figure 5:
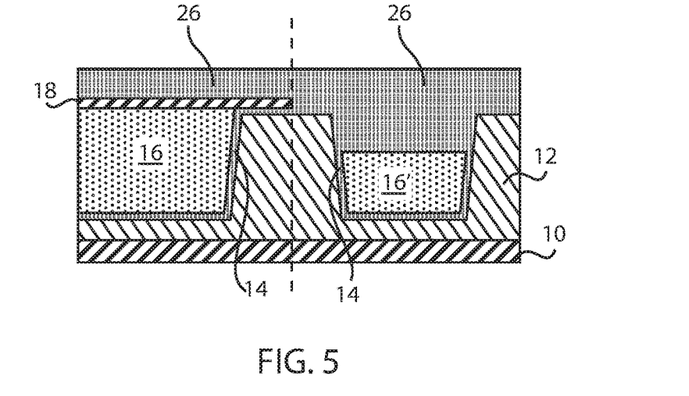
FIG. 5 is a cross-sectional view of the semiconductor device of FIG. 4 where tantalum nitride (TaN) is deposited over the recessed Cu region, in accordance with an embodiment of the present invention.

FIG. 5 is a cross-sectional view of the semiconductor device of FIG. 4 where tantalum nitride (TaN) is deposited over the recessed Cu region, in accordance with an embodiment of the present invention.

In various embodiments, tantalum nitride (TaN) 26 (or in the alternative tantalum, Ta) is deposited over the recessed Cu region 16'. The TaN 26 is also deposited over the first sacrificial layer 18 adjacent the Cu region 16.

Among the various metal liners for copper (Cu) interconnect technology, tantalum-based (Ta) materials are one of the most widely used because they provide high thermal and mechanical stability and diffusion barrier properties, and good adhesion, all of which result in good reliability. Sputtered tantalum (Ta) and reactive sputtered tantalum nitride (TaN) have been demonstrated to be good diffusion barriers between copper and a silicon substrate due to their high conductivity, high thermal stability, and resistance to diffusion of foreign atoms.

Ion-induced atomic layer deposition (iALD) is one process for depositing TaN. iALD is an example of a plasma-assisted deposition process. Another plasma-assisted deposition process is plasma-enhanced chemical vapor deposition (PECVD). iALD processes can produce TaN layers having a higher density (e.g., about 13 to 14 $g/cm^3$) compared to the density of TaN layers produced with other methods. For example, thermal atomic layer deposition (ALD) commonly produces TaN layers with a density of about 8 to 9 $g/cm^3$. iALD TaN layers also can have a higher conductivity and lower resistivity than thermal ALD TaN layers. iALD processes can have other advantages, including providing very conformal layers, a precise control of the thickness of these layers, the ability to vary the layer composition, and the ability to engineer the surface of the layer to improve the adhesion of a subsequent layer.

Figure 6:
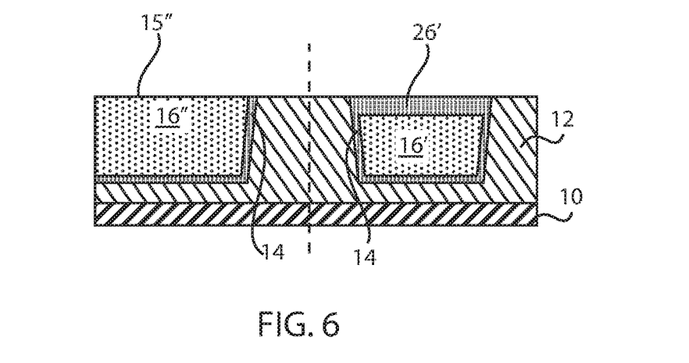
FIG. 6 is a cross-sectional view of the semiconductor device of FIG. 5 where chemical-mechanical planarization (CMP) is performed to create a blocking boundary over the recessed Cu region, in accordance with an embodiment of the present invention.

FIG. 6 is a cross-sectional view of the semiconductor device of FIG. 5 where chemical-mechanical planarization (CMP) is performed to create a blocking boundary over the recessed Cu region, in accordance with an embodiment of the present invention.

In various embodiments CMP is performed to remove the TaN 26 and the first sacrificial layer 18. Additionally, the Cu region 16 is etched back to form Cu region 16" with a top surface 15" being exposed. In contrast, the Cu region 16' includes a blocking boundary 26'. The blocking boundary 26' can also be referred to as a conductive cap. The conductive cap can be a metal cap. The Cu region 16' has a thickness greater than the thickness of the blocking boundary 26'. Moreover, the Cu region 16" has a thickness greater than the thickness of the Cu region 16' having the blocking boundary 26'.

Figure 7:
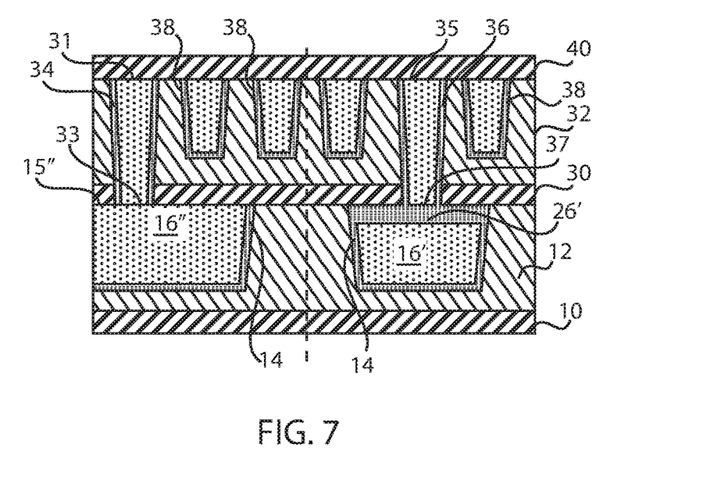
FIG. 7 is a cross-sectional view of the semiconductor device of FIG. 6 where vias are formed that are aligned with the blocking boundary created over the recessed Cu region, in accordance with an embodiment of the present invention.

FIG. 7 is a cross-sectional view of the semiconductor device of FIG. 6 where vias are formed that are aligned with the blocking boundary created over the recessed Cu region, in accordance with an embodiment of the present invention.

In various embodiments, a dielectric cap 30 is formed over the Cu regions 16' and 16". The dielectric cap 30 hermetically seals the metal below from moisture and/or oxygen. The dielectric cap 30 also acts as a Cu diffusion barrier, thus preventing 16" from escaping into the ILD above an insulator 32.

The insulator 32 is further deposited over the dielectric cap 30. A plurality of vias are subsequently formed that extend through the insulator 32. A first via 34 has a proximal end 31 and a distal end 33. The distal end 33 of the first via 34 extends to the top surface 15" of the Cu region 16". A second via 36 has a proximal end 35 and a distal end 37. The distal end 37 of the second via 36 extends to a top surface of the blocking boundary 26'. Additionally, several other trenches 38 can be formed within the insulator 32 such that they extend a certain length therewith. Both the first and second vias 34, 36 extend into the dielectric cap 30. The trenches 38 do not contact or engage the dielectric cap 30.

The first via 34 is self-aligned with the Cu region 16" and the second via 36 is self-aligned with the blocking boundary 26' and with the Cu region 16'. Stated differently, a longitudinal axis (not shown) extends through the center point of the via 36, the blocking boundary 26', and the Cu region 16'. The first via 34 does not need a blocking boundary and can thus have a very low via resistance. In contrast, the second via 36 needs a blocking boundary because this can be a specific circuit location that requires electromigration (EM) short-length. Additionally, a dielectric cap 40 can be formed over the vias 34, 36 and the trenches 38.

The dielectric cap 30 can be deposited, planarized, and etched back. The dielectric cap 30 can be, e.g., a nitride film. In an embodiment, the dielectric cap 30 can be an oxide, for example, silicon oxide (SiO), a nitride, for example, a silicon nitride (SiN), or an oxynitride, for example, silicon oxynitride (SiON).

The planarization process can be provided by chemical mechanical planarization (CMP). Other planarization process can include grinding and polishing.

In one or more embodiments, the dielectric cap 30 can have a thickness in the range of about 3 nm to about 10 nm, or in the range of about 3 nm to about 5 nm.

The dielectric cap 40 can be deposited, planarized, and etched back so that the dielectric cap 40 extends across all the proximal ends of the vias 34, 36 and the trenches 38. The dielectric cap 40 can be, e.g., a nitride film. In an embodiment, the dielectric cap 40 can be an oxide, for example, silicon oxide (SiO), a nitride, for example, a silicon nitride (SiN), or an oxynitride, for example, silicon oxynitride (SiON).

The planarization process can be provided by chemical mechanical planarization (CMP). Other planarization process can include grinding and polishing.

In one or more embodiments, the dielectric cap 40 can have a thickness in the range of about 3 nm to about 10 nm, or in the range of about 3 nm to about 5 nm.

Electromigration is a term referring to the phenomenon of mass transport of metallic atoms (e.g., copper or aluminum) which make up the interconnect material, as a result of unidirectional or DC electrical current conduction therethrough. More specifically, the electron current collides with the diffusing metal atoms, thereby pushing them in the direction of current travel. Over an extended period of time, the accumulation of metal at the anode end of the interconnect material significantly increases the local mechanical stress in the system. This in turn can lead to delamination, cracking, and even metal extrusion from the metal wire, thereby causing an electrical short to adjacent interconnects. Additionally as metal atoms migrate away from cathode they leave behind voids resulting in open circuits.

Electromigration (EM) in on-chip electrical interconnects is one of the wear out mechanisms which limit the lifetime of integrated circuits. On-chip interconnects are typically made of highly-conductive, polycrystalline metal films, such as aluminum, copper, or their alloys. In such films, electromigration typically proceeds along the network of grain boundaries. EM failures, in the form of voids or hillocks, usually occur at certain grain-boundary intersections, called "triple points", where flux divergence exists, i.e., the flux of metallic atoms entering the intersection is different from the flux of atoms leaving this intersection. However, EM failure is even more likely to occur at the end of a metal conductor where it is attached to an interlevel contact or via. When the back stress gradient balances the electromigration force, mass transport is completely suppressed. This phenomenon is referred to as the electromigration threshold or the short-length effect, and occurs for sufficiently short interconnects and low current densities.

Electromigration is a function of current density and temperature, and accelerates at high current densities and high temperatures. In addition, electromigration is a function of the grain size and the geometry of the metal line. Specifically, the width of the metal line relative to the grain size can have a significant effect on electromigration. If the width of the metal line becomes smaller than the grain size itself, all grain boundaries are perpendicular to the current flow. Such a structure is also known as a "bamboo structure." Formation of a bamboo structure results in a longer path for mass transport, thereby reducing the atomic flux and electromigration failure rate.

Further, the length of the metal line can have a significant effect on electromigration. If the length of the metal line is less than a critical length known as the "Blech length," the metal line is immune to electromigration because the electromigration force is balanced by a stress-induced back-flow of atoms.

The exemplary embodiments of the present invention avoid these aforementioned issues by allowing for the creation of localized or selective self-aligned metal caps or blocking boundaries atop of interconnects where specific circuit locations require EM short-length. Thus, the exemplary embodiments of the present invention apply the metal cap only in certain regions of interest on the chip. The metal caps prevent copper (Cu) diffusion and enable the use of the short-length effect. The metal caps or blocking boundaries are created at the via interfaces (i.e., between the top surface of the Cu region and the distal end of the via).

Figure 8:
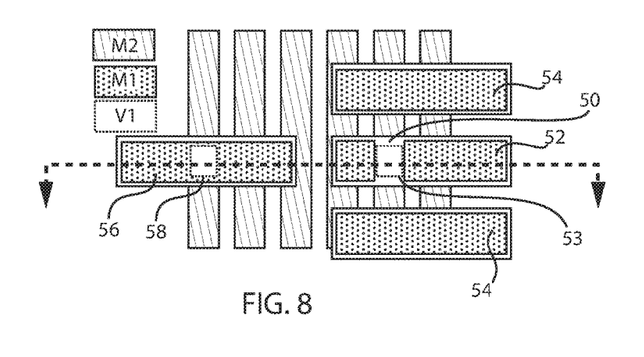
FIG. 8 is a top view of the semiconductor device of FIG. 9 where the blocking boundary is formed directly beneath the via, in accordance with an embodiment of the present invention.
Figure 9:
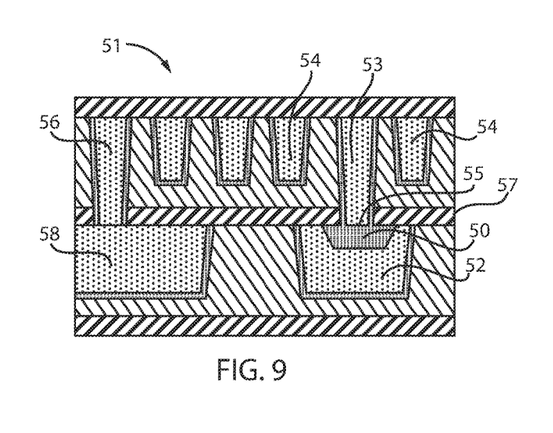
FIG. 9 is a cross-sectional view of a semiconductor device where the blocking boundary is formed directly beneath the via, in accordance with an embodiment of the present invention.

FIG. 8 is a top view of the semiconductor device of FIG. 9 where the blocking boundary is formed directly beneath the via, in accordance with an embodiment of the present invention, whereas FIG. 9 is a cross-sectional view of a semiconductor device where the blocking boundary is formed directly beneath the via, in accordance with an embodiment of the present invention.

In various embodiments, the blocking boundary can be placed directly underneath the via where the circuit requires EM short-length. The structure 51 depicts a blocking boundary 50 at a distal end 55 of via 53. The blocking boundary 50 is positioned or formed directly between the Cu region 52 and the via 53 such that the via 53, the Cu region 52, and the blocking boundary 50 are self-aligned. The structure 51 also depicts another via 56 without a blocking boundary, as well as vias 54 that do not extend into the bottom spacer 57. FIG. 8 is a top view illustrating the blocking boundary 50 at the bottom or distal end of the via 53. The top view also illustrates the other vias 54 on opposed ends of the via 53, as well as the via 56 extending to a top surface of the Cu region 58.

Figure 10:
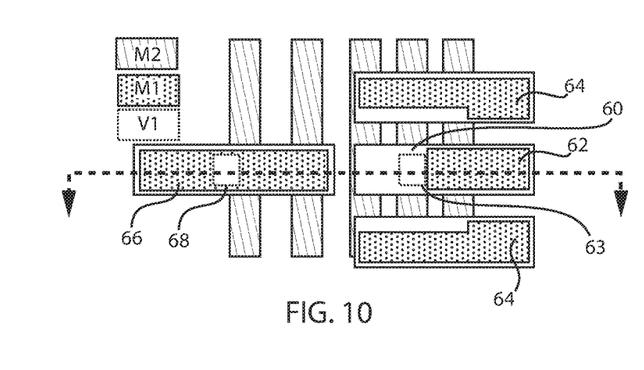
FIG. 10 is a top view of the semiconductor device of FIG. 11 where the blocking boundary is formed in areas/regions surrounding the via, in accordance with an embodiment of the present invention.
Figure 11:
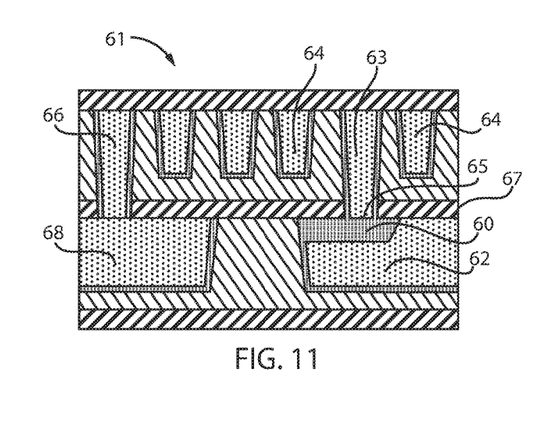
FIG. 11 is a cross-sectional view of a semiconductor device where the blocking boundary is formed in areas/regions surrounding the via, in accordance with an embodiment of the present invention.

FIG. 10 is a top view of the semiconductor device of FIG. 11 where the blocking boundary is formed in areas/regions surrounding the via, in accordance with an embodiment of the present invention, whereas FIG. 11 is a cross-sectional view of a semiconductor device where the blocking boundary is formed in areas/regions surrounding the via, in accordance with an embodiment of the present invention.

In various embodiments, the blocking boundary can be placed in an area or region surrounding the via where the circuit requires EM short-length. The structure 61 depicts a blocking boundary 60 at a distal end 65 of via 63. The blocking boundary 60 is positioned or formed in an area or region between the Cu region 62 and the via 63 such that the via 63, the Cu region 62, and the blocking boundary 60 are self-aligned. The blocking boundary 60 can extend a substantial length of the Cu region 62. For example, the blocking boundary 60 can extend over half the length of the Cu region 62. The blocking boundary 60 can extend up to the conducting liner 14.

The structure 61 also depicts another via 66 without a blocking boundary, as well as vias 64 that do not extend into the bottom spacer 67. FIG. 10 is a top view illustrating the blocking boundary 60 at the bottom or distal end of the via 63. The top view also illustrates the other vias 64 on opposed ends of the via 63, as well as the via 66 extending to a top surface of the Cu region 68.

Figure 12:
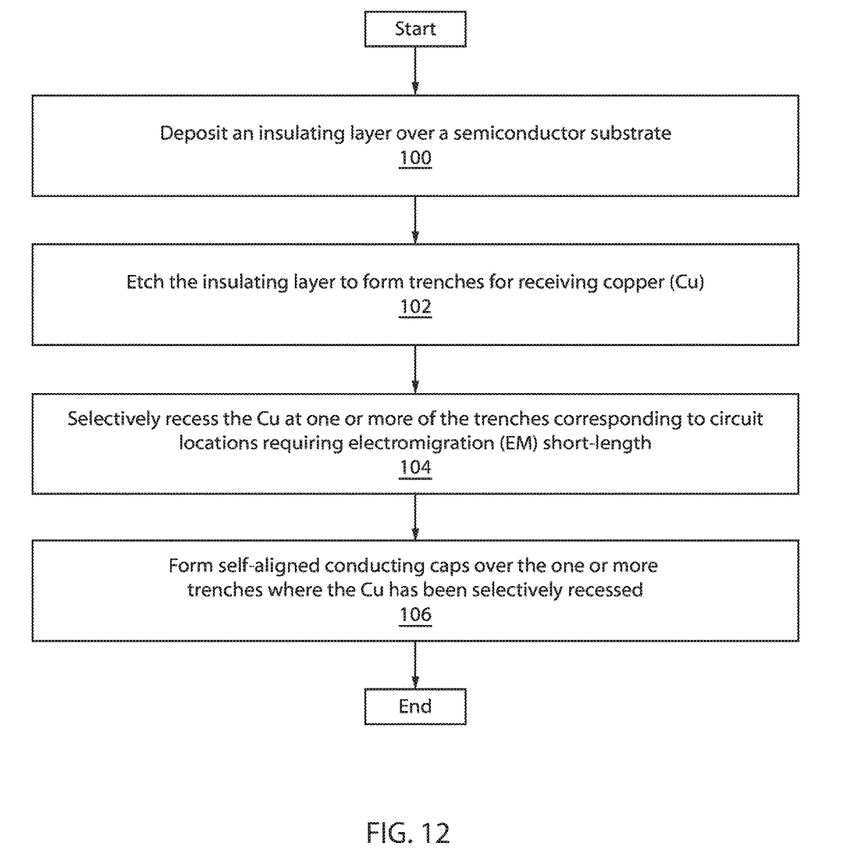
FIG. 12 is a block/flow diagram of an exemplary method for forming a semiconductor device, in accordance with an embodiment of the present invention.

FIG. 12 is a block/flow diagram of an exemplary method for forming a semiconductor device, in accordance with an embodiment of the present invention.

At block 100, an insulating layer is deposited over a semiconductor substrate.

At block 102, the insulating layer is etched to form trenches for receiving copper (Cu).

At block 104, the Cu is selectively recessed at one or more of the trenches corresponding to circuit locations requiring electromigration (EM) short-length.

At block 106, self-aligned conducting caps are formed over the one or more trenches where the Cu has been selectively recessed.

Although the exemplary embodiments described herein describe that an "electromigration short-length effect benefit" corresponds to a length at which an electromigration force applied in one direction of the conductive line is balanced by a back-flow force applied in the opposite direction of the conductive line so as to suppress mass transport of atoms of the conductive line (i.e., the prevention of electromigration damage), it is also contemplated the critical thresholds herein can also closely be approached or approximated such that some measure of electromigration would still be permissible, over an extended period of time. In this sense, an "electromigration short-length effect benefit" would be derived not necessarily by completely eliminating electromigration altogether, but by making an interconnect structure more electromigration resistant by selectively creating blocking boundaries at circuit locations that require EM short-length and by leaving alone other via interfaces that allow for low via resistance where certain circuits demand it.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for reducing parasitic back gate capacitance (which are intended to be illustrative and not limiting), it is noted that modifications and variations can be made by persons skilled in the art in light of the above teachings. It is therefore to be understood that changes can be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor structure, the method comprising:
   depositing a first insulating layer over a semiconductor substrate;
   etching the first insulating layer to form trenches for receiving copper (Cu);
   recessing the Cu in one or more of the trenches resulting in recessed Cu regions and non-recessed Cu regions, the recessed Cu regions corresponding to circuit locations calling for electromigration (EM) short-length where a first sacrificial dielectric layer used throughout the recessing remains intact over non-recessed Cu regions; and
   forming self-aligned conducting caps extending over an entire upper surface of the recessed Cu corresponding to the circuit locations calling for EM short-length.

2. The method of claim 1, wherein the conducting caps are tantalum nitride (TaN) caps.

3. The method of claim 1, further comprising forming a via in a second insulating layer formed over the first insulating layer, the via extending into each of the trenches for receiving Cu.

4. The method of claim 3, wherein the via for trenches including recessed Cu regions extends to the self-aligned conducting cap.

5. The method of claim 3, wherein the via for trenches including the non-recessed Cu regions extends to a top surface of the Cu.

6. The method of claim 5, wherein the via allows for a low via resistance.

7. The method of claim 1, wherein the self-aligned conducting cap creates a blocking boundary directly beneath a distal end of a via extending toward the Cu.

8. The method of claim 1, wherein the self-aligned conducting cap creates a blocking boundary in a region surrounding a distal end of a via extending toward the Cu.

9. The method of claim 1, wherein the Cu is recessed by applying the first sacrificial layer, a second sacrificial layer, and a low temperature oxide (LTO).

10. The method of claim 1, wherein the first sacrificial dielectric layer is silicon nitride (SiN) and the second sacrificial layer is titanium nitride (TiN).

* * * * *